(12) United States Patent
Chou et al.

(10) Patent No.: US 11,508,673 B2
(45) Date of Patent: Nov. 22, 2022

(54) SEMICONDUCTOR PACKAGING SUBSTRATE, FABRICATION METHOD AND PACKAGING PROCESS THEREOF

(71) Applicant: PHOENIX PIONEER TECHNOLOGY CO., LTD., Hsinchu County (TW)

(72) Inventors: Pao-Hung Chou, Hsinchu County (TW); Chun-Hsien Yu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 17/202,632

(22) Filed: Mar. 16, 2021

(65) Prior Publication Data

US 2021/0296260 A1    Sep. 23, 2021

(30) Foreign Application Priority Data

Mar. 19, 2020    (TW) .................................. 109109205

(51) Int. Cl.
*H01L 23/538* (2006.01)
*H01L 23/00* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ............... H01L 23/562; H01L 21/4853; H01L 21/4857; H01L 21/565; H01L 21/6835; H01L 23/3128; H01L 23/5383; H01L 23/5386; H01L 24/16; H01L 2221/68372; H01L 2224/16227; H01L 2924/3511; H01L 23/295; H01L 23/49816; H01L 2221/68327; H01L 21/56; H01L 23/49811; H01L 2221/68345; H01L 2221/68381;
(Continued)

(56) References Cited

U.S. PATENT DOCUMENTS

6,770,971 B2 * 8/2004 Kouno .................... H01L 24/97
257/734
9,461,018 B1 * 10/2016 Tsai ........................ H01L 21/78
(Continued)

*Primary Examiner* — Vu A Vu
(74) *Attorney, Agent, or Firm* — Amin, Turocy & Watson, LLP (57) ABSTRACT

A semiconductor packaging substrate is provided and includes: an insulating layer, a thinned circuit structure formed of circuit layers and conductive posts stacked on one another embedding in the insulating layer, and a supporting structure formed on the insulating layer and having at least one through hole exposing the conductive posts. As such, before a subsequent packaging operation, the packaging substrate can be electrically tested and screened so as to prevent a defective packaging substrate from being misused in the subsequent packaging operation and hence avoid the loss of normal electronic elements. A method for fabricating a semiconductor packaging substrate and a packaging process using the semiconductor packaging substrate are also provided.

8 Claims, 6 Drawing Sheets

(51) Int. Cl.
*H01L 23/31* (2006.01)
*H01L 21/48* (2006.01)
*H01L 21/56* (2006.01)
*H01L 21/683* (2006.01)

(52) U.S. Cl.
CPC ........ *H01L 21/565* (2013.01); *H01L 21/6835* (2013.01); *H01L 23/3128* (2013.01); *H01L 23/5383* (2013.01); *H01L 23/5386* (2013.01); *H01L 24/16* (2013.01); *H01L 2221/68372* (2013.01); *H01L 2224/16227* (2013.01); *H01L 2924/3511* (2013.01)

(58) Field of Classification Search
CPC . H01L 23/49822; H01L 21/50; H01L 21/568; H01L 22/14; H01L 23/49838
USPC ......................................... 257/668
See application file for complete search history.

(56) References Cited

U.S. PATENT DOCUMENTS 10,021,780 B2 * 7/2018 Yamauchi ................ H05K 3/18
10,134,693 B2 * 11/2018 Inagaki ................ H01L 23/485

* cited by examiner

SEMICONDUCTOR PACKAGING SUBSTRATE, FABRICATION METHOD AND PACKAGING PROCESS THEREOF

CROSS-REFERENCE TO RELATED APPLICATIONS

This application claims priority to Taiwan Application Serial No. 109109205, filed on Mar. 19, 2020. The entirety of the application is hereby incorporated by reference herein and made a part of this application.

BACKGROUND

1. Technical Field

The present disclosure relates to semiconductor packaging substrates, and more particularly, to a semiconductor packaging substrate for thinned products, a fabrication method and a packaging process thereof.

2. Description of Related Art

Along with the rapid development of electronic industries, electronic products are developed toward the trend of multi-function and high performance. To improve the wiring precision of multi-layer circuit boards, a built-up technique has been developed. For example, a plurality of dielectric layers and a plurality of circuit layers are alternately stacked on two opposite surfaces of a core board by using a circuit built-up technique and conductive vias are formed in the dielectric layers for electrically connecting between upper and lower circuit layers.

However, since the core board has a thickness of approximately 30 to 50 μm, the packaging substrate cannot meet the thinning requirement. Therefore, a coreless packaging technique has been developed to meet the miniaturization requirement.

Figure 1A:
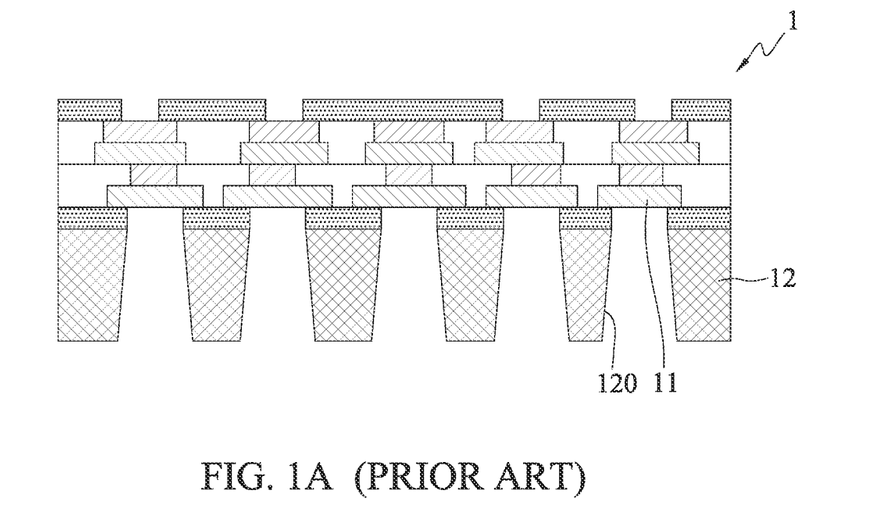
FIGS. 1A and 1B are schematic cross-sectional views showing a method for fabricating a semiconductor package according to the prior art.
Figure 1B:
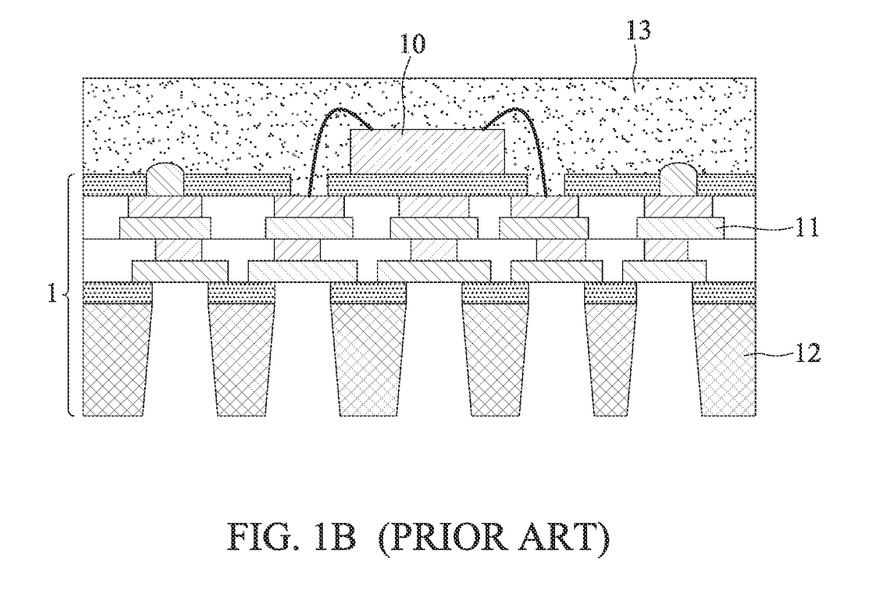

FIGS. 1A and 1B are schematic cross-sectional views showing a method for fabricating a semiconductor package as depicted by Taiwan patent publication No. TW201913906.

Referring to FIG. 1A, a packaging substrate 1 having a circuit layer 11 and a supporting member 12 is provided. The supporting member 12 has a plurality of openings 120 exposing portions of the circuit layer 11. The supporting member 12 is an insulating board, a semiconductor board or a metal board.

In a subsequent electrical test of the packaging substrate 1, a test probe can be electrically connected to the circuit layer 11 through the openings 120.

Referring to FIG. 1B, if the circuit layer 11 of the packaging substrate 1 is determined to be normal, a packaging process is performed. For example, at least one semiconductor chip 10 is disposed on the packaging substrate 1 and electrically connected to the circuit layer 11, and an encapsulant 13 is formed to encapsulate the semiconductor chip 10. After the packaging process, the supporting member 12 can be removed by chemical etching.

On the other hand, if the circuit layer 11 of the packaging substrate 1 is abnormal, the packaging substrate 1 is scrapped and the packaging process is not performed to the packaging substrate 1.

However, since the supporting member 12 is an insulating board, a semiconductor board or a metal board, it is not easy to form the openings 120, and the alignment error of the openings 120 is too great. As such, in the subsequent electrical test of the packaging substrate 1, the test probe may be easily inserted into a wrong opening 120 and miscontact the circuit layer 11. Therefore, prior to a packaging operation, an error may easily occur to the electrical test and screening operation of the packaging substrate 1. Consequently, during the packaging process (as shown in FIG. 1B), a normal semiconductor chip 10 may be disposed on a defective packaging substrate 1 and hence the normal semiconductor chip 10 is scrapped along with the defective packaging substrate 1, thereby significantly increasing the overall fabrication cost of the semiconductor package 1.

Further, Taiwan patent No. I531038 describes a supporting substrate having an opening. But the alignment error of the opening is also too great.

Therefore, how to overcome the problems of the prior art is becoming an urgent issue in the art.

SUMMARY

In view of the above-described drawbacks, the present disclosure provides a semiconductor packaging substrate, which comprises: a circuit structure comprising: a plurality of circuit layers each having opposite first and second electrical surfaces; a plurality of conductive posts each having opposite first and second end surfaces, wherein the plurality of conductive posts are vertically arranged on the first electrical surfaces of the circuit layers through the second end surfaces thereof; and a plurality of insulating layers each having opposite first and second surfaces, wherein the plurality of insulating layers encapsulate the circuit layers and the conductive posts, and wherein the first end surfaces of the conductive posts on one side of the semiconductor packaging substrate are exposed from the first surface of the insulating layer and the second electrical surface of the circuit layer on another side of the semiconductor packaging substrate is exposed from the second surface of the insulating layer; and a supporting structure arranged on the first surface of the insulating layer on one side of the circuit structure, wherein the supporting structure has at least one through hole for exposing the first end surfaces of the conductive posts, the supporting structure is made of a photosensitive insulating material, and the supporting structure is a removable and disposable structure.

The present disclosure further provides a method for fabricating a semiconductor packaging substrate, which comprises: providing a carrier; forming a circuit layer and a conductive post on the carrier, wherein the circuit layer has opposite first and second electrical surfaces, and the conductive post has opposite first and second end surfaces, the circuit layer is attached onto the carrier through the second electrical surface thereof, and the conductive post is vertically arranged on the first electrical surface of the circuit layer through the second end surface thereof; forming an insulating layer having opposite first and second surfaces on the carrier for encapsulating the circuit layer and the conductive post, wherein the first end surface of the conductive post is exposed from the first surface of the insulating layer and the second electrical surface of the circuit layer is exposed from the second surface of the insulating layer, such that the insulating layer, the circuit layer and the conductive post form a thinned circuit structure; forming a supporting structure on the first surface of the insulating layer, wherein the supporting structure has at least one through hole for exposing the first end surface of the conductive post, the supporting structure is made of a photosensitive insulating material, and the supporting structure is a removable and disposable structure; and removing the carrier to expose the second surface of the insulating layer and the second electrical surface of the circuit layer, wherein the circuit structure and the supporting structure form a thinned packaging substrate.

In the above-described method, the through hole of the supporting structure can be formed by lithography.

In the above-described substrate and method, the supporting structure can be made of a photosensitive dielectric material or a photosensitive dry film material.

The present disclosure further provides a semiconductor packaging process, which comprises the steps of: providing the semiconductor packaging substrate as described above; bonding at least one electronic element onto the second surface of the insulating layer to electrically connect the electronic element and the circuit layer; forming a packaging layer on the second surface of the insulating layer to encapsulate the electronic element; and completely removing the supporting structure to expose the first surface of the insulating layer and the first end surfaces of the conductive posts.

In the above-described process, the supporting structure can be removed by a chemical method, laser, plasma, sandblasting or mechanical grinding.

After completely removing the supporting structure, the above-described process can further comprise forming a conductive element on the first surface of the insulating layer to electrically connect the first end surfaces of the conductive posts.

According to the semiconductor packaging substrate, fabrication method and packaging process thereof of the present disclosure, the supporting structure is made of a photosensitive insulating material so as to facilitate formation and precise alignment of the through hole and avoid too great alignment error. Therefore, before a semiconductor packaging operation, an electrical test can be performed to the packaging substrate so as to determine whether the packaging substrate is normal. Compared with the prior art, the present disclosure prevents a defective packaging substrate from being misused in the subsequent packaging operation and hence avoids the loss of normal electronic elements, thereby reducing the overall fabrication cost of the electronic package and improving the subsequent production efficiency.

Further, the circuit structure can be thinned as much as possible through the supporting structure that provides a temporary rigidity support. Furthermore, the total thickness of the circuit structure combined with the supporting structure can meet general packaging specification requirements. Therefore, no warp occurs to the packaging substrate before the packaging process, and the packaging operation of the thinned electronic package can be completed by using general packaging equipment, thus eliminating the need to spend a lot of money on modifying or purchasing packaging equipment for meeting thinned packaging specifications.

DETAILED DESCRIPTION

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first," "second," "on," "a," etc., are merely for illustrative purposes and should not be construed to limit the scope of the present disclosure.

FIGS. 2A to 2F are schematic cross-sectional views showing a method for fabricating a semiconductor packaging substrate 2 according to the present disclosure.

In an embodiment, the semiconductor packaging substrate 2 is coreless and serves as a substrate for a flip-chip chip scale package (FCCSP).

Figure 2A:
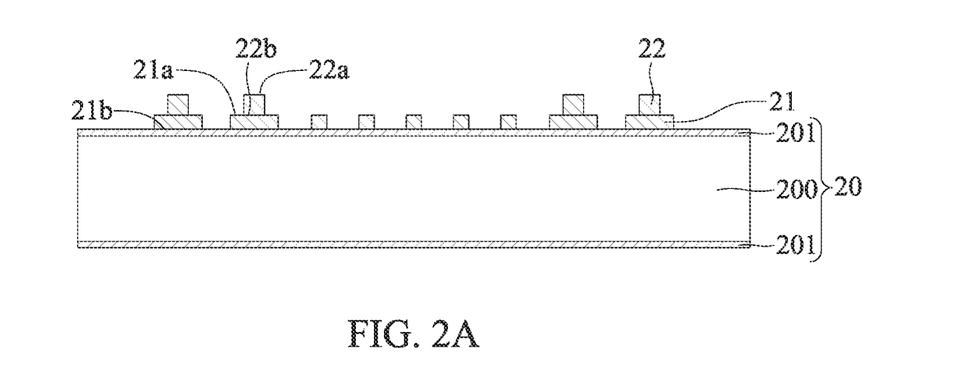
FIGS. 2A to 2F are schematic cross-sectional views showing a method for fabricating a semiconductor packaging substrate according to the present disclosure.

Referring to FIG. 2A, a carrier 20 is provided, and a circuit layer 21 is formed on the carrier 20 through a patterning process. The circuit layer 21 has a first electrical surface 21a and a second electrical surface 21b opposite to the first electrical surface 21a. The circuit layer 21 is attached onto the carrier 20 through the second electrical surface 21b thereof. Further, through a patterning process, a plurality of conductive posts 22 are formed on the circuit layer 21 by electroplating. Each of the conductive posts 22 has a first end surface 22a and a second end surface 22b opposite to the first end surface 22a. The conductive posts 22 are vertically arranged on the first electrical surface 21a of the circuit layer 21 through the second end surface 22b thereof.

In an embodiment, the carrier 20 is an insulating board, a ceramic board, a copper foil substrate or a glass board, but the present disclosure is not limited to as such. In an embodiment, the carrier 20 is a copper foil substrate having a body 200 and copper layers 201 formed on two opposite surfaces of the body 200.

Figure 2B:
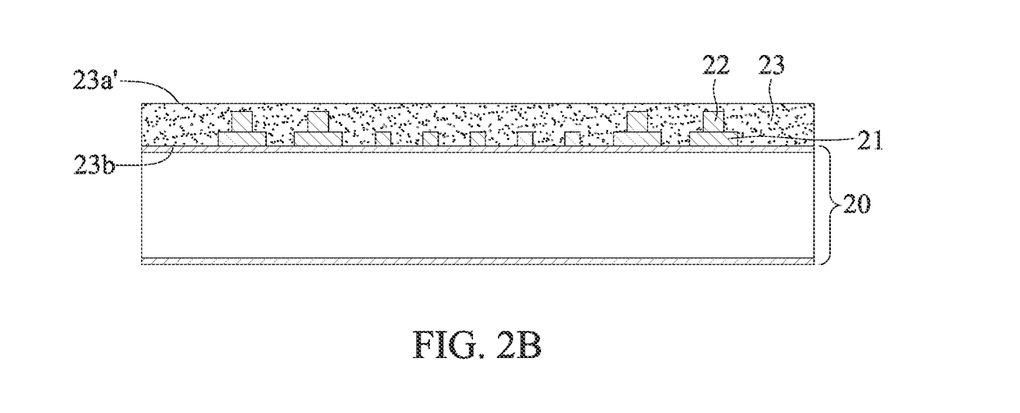

Referring to FIG. 2B, an insulating layer 23 is formed on the carrier 20 to encapsulate the circuit layer 21 and the plurality of conductive posts 22. The insulating layer 23 has a thickness t less than or equal to 60 μm, for example, 20 to 60 μm (as shown in FIG. 2C).

In an embodiment, the insulating layer 23 has a first surface 23a' and a second surface 23b opposite to the first surface 23a'. The insulating layer 23 is bonded onto the carrier 20 through the second surface 23b thereof.

Moreover, the insulating layer 23 is formed on the carrier 20 by molding, coating or lamination. The insulating layer 23 is made of a dielectric material such as an epoxy resin, a molding compound or a primer, for example, an epoxy molding compound (EMC). The epoxy molding compound contains 70 to 90 wt % of a filler.

Figure 2C:
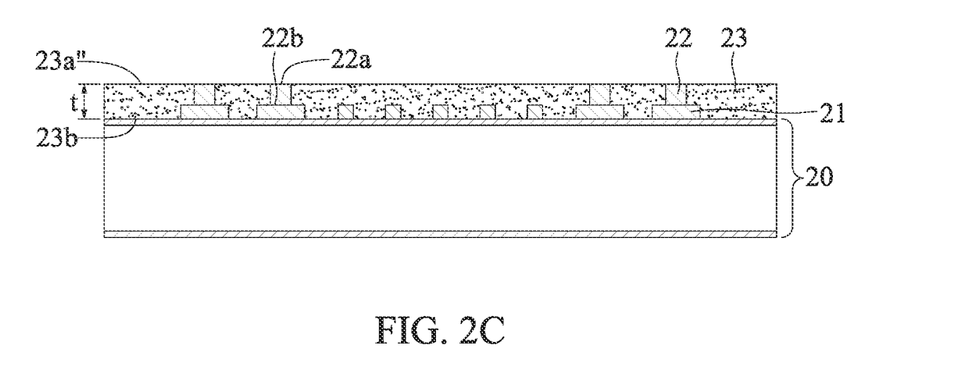

Referring to FIG. 2C, the insulating layer 23 is partially removed from the first surface 23a' thereof such that the first surface 23a" of the insulating layer 23 is flush with (i.e., coplanar with) the first end surfaces 22a of the conductive posts 22, thus exposing the first end surfaces 22a of the conductive posts 22 from the first surface 23a" of the insulating layer 23.

In another embodiment, the conductive posts 22 are selectively and partially removed from the first end surfaces 22a thereof by such as etching or other subtractive methods such that the first end surfaces 22a of the conductive posts 22 are recessed to be lower than the first surface 23a" of the insulating layer 23.

Figure 2D:
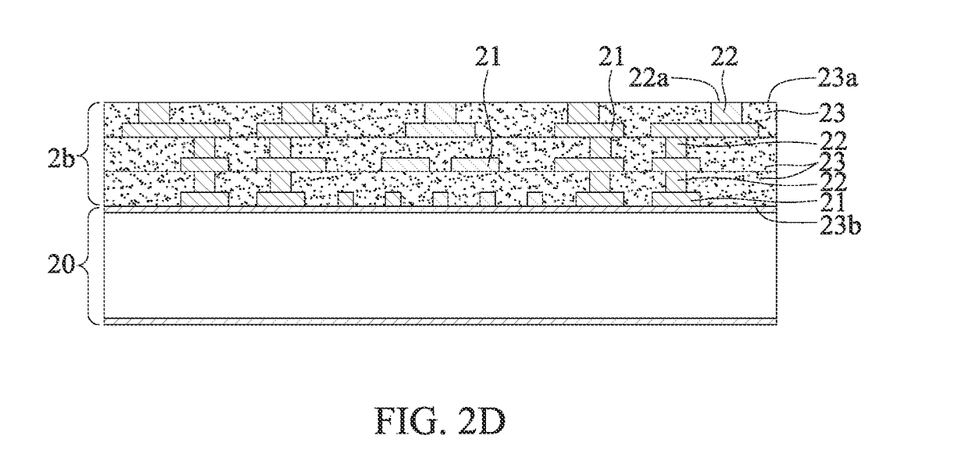

Referring to FIG. 2D, at least one circuit layer 21, at least one conductive post 22 and at least one insulating layer 23 can further be formed on the first surface 23a" of the insulating layer 23 such that the circuit layers 21 (three layers in the drawing), the conductive posts 22 (three layers in the drawing) and the insulating layers 23 (three layers in the drawing) form a thinned circuit structure 2b. According to the practical need, the thinned circuit structure 2b can be formed of a single layer of circuit layer 21, conductive post 22 and insulating layer 23, or formed of a plurality of circuit layers 21, conductive posts 22 and insulating layers 23.

In an embodiment, the first surface 23a of the outermost insulating layer 23 is flush with (i.e., coplanar with) the first end surfaces 22a of the outermost conductive posts 22, and the first end surfaces 22a of the outermost conductive posts 22 are exposed from the first surface 23a of the outermost insulating layer 23. Alternatively, the first end surfaces 22a of the conductive posts 22 can be recessed into or protruded from the first surface 23a of the insulating layer 23. That is, the first end surfaces 22a of the conductive posts 22 can be flush with, recessed into or protruded from the first surface 23a of the insulating layer 23 according to the practical need.

Further, a surface processing layer (not shown) can be selectively formed on the first end surfaces 22a of the outermost conductive posts 22. The surface of the surface processing layer can be recessed into, flush with or protruded from the first surface 23a of the outermost insulating layer 23. For example, the surface processing layer can be made of a copper surface protectant, an organic solderability preservative (OSP), electroplated Ni/Pd/Au, electroless nickel electroless palladium immersion gold (ENEPIG), electroplated Ni/Au, plated tin, plated silver or a combination thereof.

Figure 2E:
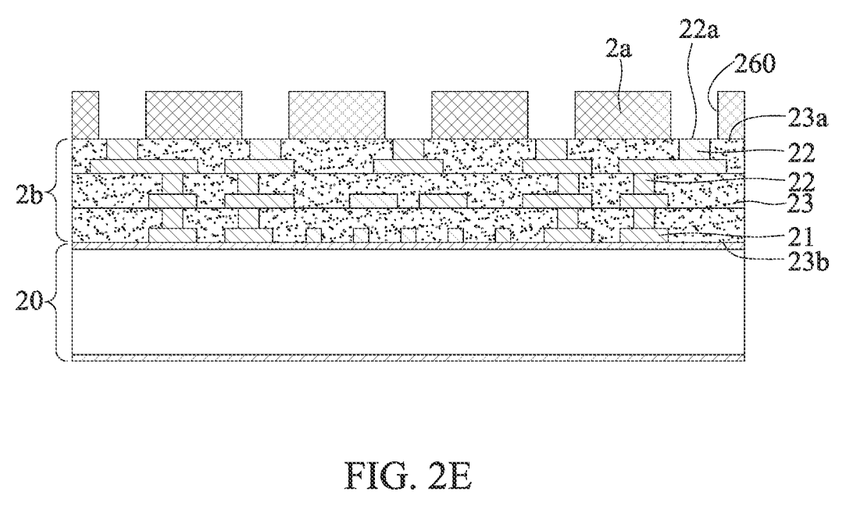

Referring to FIG. 2E, a supporting structure 2a made of an insulating material is formed on the first surface 23a of the circuit structure 2b.

In an embodiment, the supporting structure 2a is made of a photosensitive insulating material or an epoxy resin base material, such as bismaleimide triazine (BT), FR-4, FR-5 or the like (wherein the photosensitive insulating material is preferred), and formed on the first surface 23a of the insulating layer 23 by such as molding, coating or lamination.

Further, at least one through hole 260 is formed on the supporting structure 2a relative to the conductive posts 22 so as to expose the first end surfaces 22a of the outermost conductive posts 22 (or the surface processing layer thereon). In an embodiment, the through hole 260 can be formed by exposure and development, laser, plasma or sandblasting.

Figure 2F:
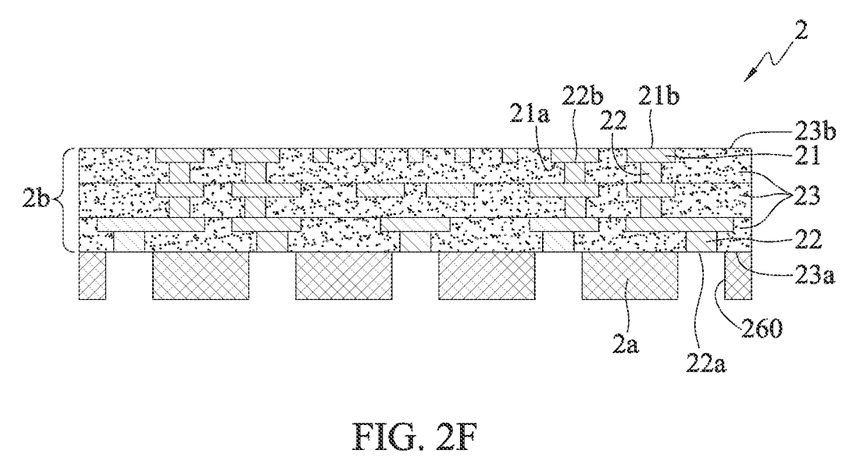

Referring to FIG. 2F, the carrier 20 is completely removed so as to completely expose the second surface 23b of the insulating layer 23. Also, the second electrical surface 21b of the circuit layer 21 is exposed from the second surface 23b of the insulating layer 23.

In an embodiment, the carrier 20 and the metal layers 201 are removed by etching (or other subtractive methods). Therefore, portions of the second electrical surface 21b of the circuit layer 21 may be slightly etched such that the second electrical surface 21b of the circuit layer 21 is recessed into and lower than the second surface 23a of the insulating layer 23.

Further, a leveling process can be selectively performed so as to cause the second surface 23b of the insulating layer 23 and the second electrical surface 21b of the circuit layer 21 to be flush with one another.

In another embodiment, a patterned electroplating process can be selectively performed to form conductive bumps (not shown) on the second electrical surface 21b of the circuit layer 21, thereby facilitating a subsequent chip packaging processes.

As such, a semiconductor packaging substrate 2 having a total thickness greater than or equal to 100 μm is obtained (i.e., a combination of the supporting structure 2a having the through hole 260 and the thinned circuit structure 2b) so as to meet specification requirements of general semiconductor packaging equipment of current packaging plants (if the semiconductor packaging substrate 2 is too thin, a lot of money must be spent on modifying or purchasing semiconductor packaging equipment meeting thinned packaging specifications).

Further, when an electrical test is performed to the semiconductor packaging substrate 2, a part of contact terminals (not shown) of the test equipment are inserted into the through holes 260 to contact the first end surfaces 22a of the conductive posts 22 (or the surface processing layer thereon) on one side of the semiconductor packaging substrate 2 and another part of the contact terminals (not shown) of the test equipment contact the second electrical surface 21b of the circuit layer 21 on the other side of the semiconductor packaging substrate 2 so as to test the electrical state of the circuit layer 21 and the conductive posts 22. As such, if the semiconductor packaging substrate 2 is determined to be defective, it is scrapped.

According to the present disclosure, the supporting structure 2a is made of a photosensitive insulating material so as to facilitate formation and precise alignment of the through hole 260 and avoid too great alignment error. Further, since the supporting structure 2a provides a temporary supporting rigidity to the thinned circuit structure 2b and the conductive posts 22 are exposed from the through hole 260, an electrical test and screening operation can be pre-performed to the thinned semiconductor packaging substrate 2 so as to prevent the semiconductor packaging substrate 2 (if it is determined to be defective) from being misused in the subsequent semiconductor packaging process and hence avoid the loss of normal electronic elements and reduce the production cost. Therefore, the present disclosure completely overcomes the conventional drawback that related products cannot be electrically tested or screened. Further, the thinned semiconductor packaging substrate 2 having the thinned circuit structure 2b fully meets the specification requirements of packaging equipment of current packaging plants, thus eliminating the need to spend a lot of money on modifying or purchasing packaging equipment meeting thinned packaging specifications.

The subsequent packaging process uses the semiconductor packaging substrate 2 and is performed as shown in FIGS. 3A to 3D.

Figure 3A:
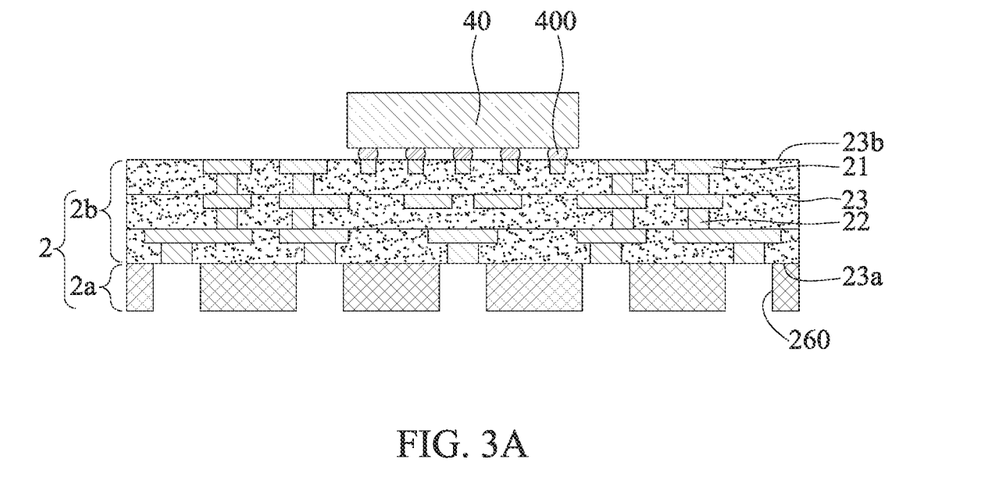
FIGS. 3A to 3D are schematic cross-sectional views showing a subsequent packaging process of FIG. 2F.

Referring to FIG. 3A, at least one electronic element 40 is disposed on the second surface 23b of the insulating layer 23 of the semiconductor packaging substrate 2 that is determined to be normal through the electrical test and screening operation.

In an embodiment, the electronic element 40 is an active element, a passive element, or a combination of both. The active element is, for example, a semiconductor chip, and the passive element is a resistor, a capacitor, or an inductor. For example, the electronic element 40 is a semiconductor chip, which is electrically connected to the circuit layer 21 of the semiconductor packaging substrate 2 in a flip-chip manner through a plurality of conductors 400 such as copper bumps or solder bumps. Alternatively, the electronic element 40 can be electrically connected to the circuit layer 21 in a wire-bonding manner through a plurality of conductors such as bonding wires (not shown). Further, the electronic element 40 can be in direct contact with the circuit layer 21. But it should be noted that the electrical connection between the electronic element 40 and the circuit layer 21 is not limited to the above-described examples.

Figure 3B:
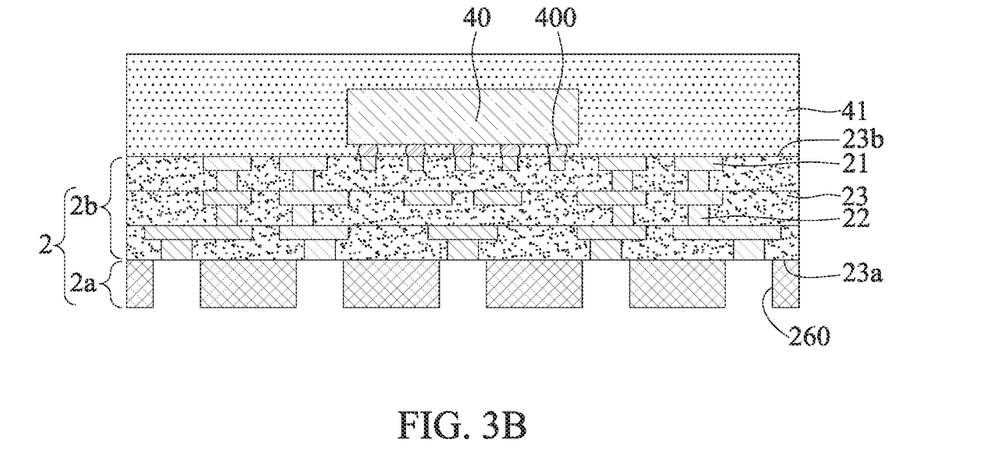

Referring to FIG. 3B, a packaging layer 41 is formed on the second surface 23b of the insulating layer for encapsulating the electronic element 40. The encapsulation and supporting rigidity provided by the packaging layer 41 can protect the finished product against deformation or damage.

In an embodiment, the packaging layer 41 can be a thin film used in a lamination process, a molding material used in a molding process, or an adhesive material used in a printing process for encapsulating the electronic element 40 and the plurality of conductors 400. The packaging layer 41 can be made of polyimide (PI), an epoxy resin or a molding compound. Alternatively, the packaging layer 41 can be an underfill formed between the semiconductor packaging substrate 2 and the electronic element 40 for encapsulating the plurality of conductors 400. However, the way in which the electronic element 40 is packaged is not limited as such.

Figure 3C:
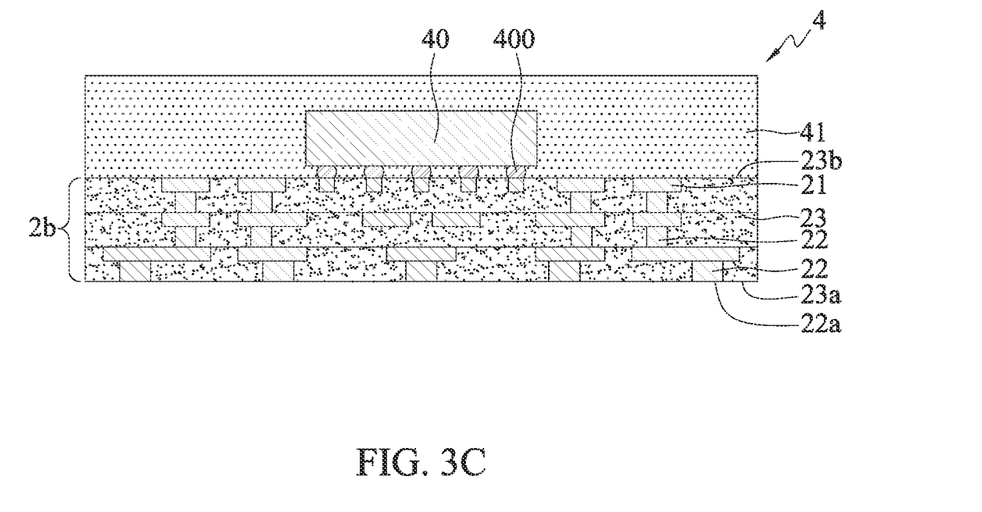

Referring to FIG. 3C, the supporting structure 2a is completely removed by a chemical method, laser, plasma, sandblasting, or mechanical grinding so as to expose the first surface 23a of the insulating layer 23 and the first end surface 22a of the conductive posts 22 (or the surface processing layer thereon).

As such, a thinned electronic package 4 is formed. The total thickness of the thinned circuit structure 2b combined with the supporting structure 2a that provides a temporary supporting rigidity can meet the specification requirements of general packaging equipment of packaging plants. Thus, the packaging process of the thinned electronic package 4 can be successfully completed without the need to spend a lot of money on modifying or purchasing packaging equipment meeting thinned packaging specifications. Further, through the encapsulation and supporting rigidity provided by the packaging layer 41, even if the supporting structure 2a is completely removed, the thinned electronic package 4 can still maintain a proper rigidity without deformation or damage.

Figure 3D:
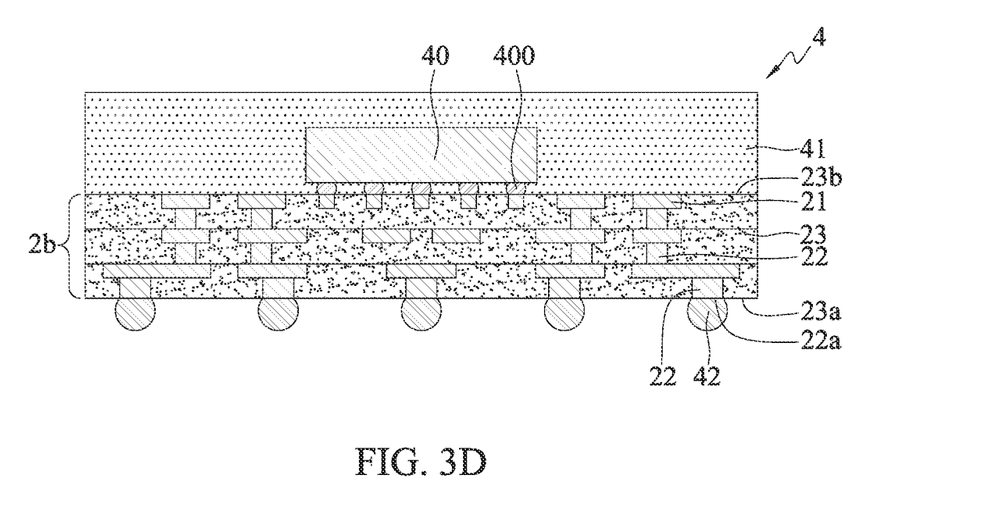

Referring to FIG. 3D, a plurality of conductive elements 42 such as solder balls are formed on the first surface 23a of the insulating layer 23 and electrically connected to the first end surface 22a of the conductive posts 22 (or the surface processing layer thereon). Further, the electronic package 4 can be bonded to a printed circuit board (PCB) through the conductive elements 42.

According to the present disclosure, the supporting structure 2a is made of a photosensitive insulating material so as to facilitate formation and precise alignment of the through hole 260 and avoid too great alignment error. Therefore, before a packaging operation of the electronic element 40, the thinned semiconductor packaging substrate 2 can be electrically tested and screened through the through hole 260 and scrapped if the semiconductor packaging substrate 2 is defective. Therefore, the present disclosure prevents the normal electronic element 40 from being disposed on the defective semiconductor packaging substrate 2 and hence avoids the loss of the normal electronic element 40, thereby effectively reducing the overall fabrication cost of the thinned electronic package 4.

Further, the supporting structure 2a improves the rigidity of the overall structure of the semiconductor packaging substrate 2. As such, no warp or deformation occurs to the thinned circuit structure 2b before the packaging process. Furthermore, the total thickness of the thinned circuit structure 2b combined with the supporting structure 2a can meet the specification requirements of general packaging equipment of packaging plants. Therefore, the thinned semiconductor packaging substrate 2 of the present disclosure can be used as a packaging substrate for the electronic element 40, and the packaging process of the thinned electronic package 4 can be completed by using general packaging equipment, thus eliminating the need to spend a lot of money on modifying or purchasing packaging equipment meeting thinned packaging specifications.

The present disclosure further provides a semiconductor packaging substrate 2 (as shown in FIG. 2F), which includes a circuit structure 2b and a supporting structure 2a. The circuit structure 2b includes a plurality of circuit layers 21, a plurality of conductive posts 22 and a plurality of insulating layers 23.

Each of the circuit layers 21 has a first electrical surface 21a and a second electrical surface 21b opposite to the first electrical surface 21a.

Each of the conductive posts 22 has a first end surface 22a and a second end surface 22b opposite to the first end surface 22a, wherein the plurality of conductive posts 22 are vertically arranged on the first electrical surfaces 21a of the circuit layers 21 through the second end surfaces 22b thereof.

The plurality of insulating layers 23 are encapsulated the circuit layers 21 and the conductive posts 22, wherein each of the insulating layers 23 has a first surface 23a and a second surface 23b opposite to the first surface 23a, such that the first end surfaces 22a of the conductive posts 22 on one side of the semiconductor packaging substrate 2 are exposed from the first surface 23a of the insulating layer 23 and the second electrical surface 21b of the circuit layer 21 on the other side of the semiconductor packaging substrate 2 is exposed from the second surface 23b of the insulating layer 23.

The supporting structure 2a is arranged on the first surface 23a of the insulating layer 23 on one side of the circuit structure 2b, and the supporting structure 2a has at least one through hole 260 (corresponding to the conductive posts 22) for exposing the first end surfaces 22a of the conductive posts 22. The supporting structure 2a is made of a photosensitive insulating material.

In an embodiment, the supporting structure 2a is made of a photosensitive dielectric material or a photosensitive dry film material.

In an embodiment, the supporting structure 2a is formed of an insulating material comprising an epoxy resin base material.

Therefore, in a semiconductor packaging substrate 2 and fabricating method thereof according to the present disclosure, through the design of the supporting structure 2a made of a photosensitive insulating material and having at least one through hole 260, an electrical test can be performed to the semiconductor packaging substrate 2 before the semiconductor packaging operation. As such, if the semiconductor packaging substrate 2 is determined to be defective, the semiconductor packaging substrate 2 can be scrapped so as to prevent it from being misused in the subsequent packaging operation and hence avoid the loss of the normal electronic element 40, thereby effectively reducing the overall fabrication cost of the thinned electronic package 4 and improving the subsequent production efficiency.

Further, the circuit structure 2b can be thinned as much as possible through the supporting structure 2a that provides a temporary rigidity support. Furthermore, the total thickness of the circuit structure 2b combined with the supporting structure 2a can meet specification requirements of general packaging equipment. Therefore, no warp occurs to the thinned semiconductor packaging substrate 2 before the packaging process, and the packaging operation of the thinned electronic package 4 can be completed by using general packaging equipment, thus eliminating the need to spend a lot of money on modifying or purchasing packaging equipment meeting thinned packaging specifications.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. A semiconductor packaging substrate, comprising:
a circuit structure, comprising:
a plurality of circuit layers each having opposite first and second electrical surfaces;
a plurality of conductive posts each having opposite first and second end surfaces, wherein the plurality of conductive posts are vertically arranged on the first electrical surfaces of the circuit layers through the second end surfaces thereof; and
a plurality of insulating layers each having opposite first and second surfaces, wherein the plurality of insulating layers encapsulate the circuit layers and the conductive posts, and wherein the first end surfaces of the conductive posts on one side of the semiconductor packaging substrate are exposed from the first surface of the insulating layer and the second electrical surface of the circuit layer on another side of the semiconductor packaging substrate is exposed from the second surface of the insulating layer; and
a supporting structure arranged on the first surface of the insulating layer on one side of the circuit structure, wherein the supporting structure is used to increase an overall thickness of the semiconductor packaging substrate, wherein the supporting structure has at least one through hole for exposing the first end surfaces of the conductive posts to test an electrical state of the circuit layer and the conductive post, the supporting structure is made of a photosensitive insulating material, and the supporting structure is a removable and disposable structure.

2. The semiconductor packaging substrate of claim 1, wherein the supporting structure is made of a photosensitive dielectric material or a photosensitive dry film material.

3. A semiconductor packaging process, comprising:
providing the semiconductor packaging substrate of claim 1;
inserting a contact terminal of a test equipment into the through hole to test an electrical state of the circuit layer and the conductive post;
after testing the electrical state of the circuit layer and the conductive post, bonding at least one electronic element onto the second surface of the insulating layer to electrically connect the electronic element and the circuit layer;
forming a packaging layer on the second surface of the insulating layer to encapsulate the electronic element; and
completely removing the supporting structure to expose the first surface of the insulating layer and the first end surfaces of the conductive posts.

4. The semiconductor packaging process of claim 3, wherein the supporting structure is removed by a chemical method, laser, plasma, sandblasting or mechanical grinding.

5. The semiconductor packaging process of claim 3, further comprising, after completely removing the supporting structure, forming a conductive element on the first surface of the insulating layer to electrically connect the first end surfaces of the conductive posts.

6. A method for fabricating a semiconductor packaging substrate, comprising:
providing a carrier;
forming a circuit layer and a conductive post on the carrier, wherein the circuit layer has opposite first and second electrical surfaces, and the conductive post has opposite first and second end surfaces, the circuit layer is attached onto the carrier through the second electrical surface thereof, and the conductive post is vertically arranged on the first electrical surface of the circuit layer through the second end surface thereof;
forming an insulating layer having opposite first and second surfaces on the carrier for encapsulating the circuit layer and the conductive post, wherein the first end surface of the conductive post is exposed from the first surface of the insulating layer and the second electrical surface of the circuit layer is exposed from the second surface of the insulating layer, such that the insulating layer, the circuit layer and the conductive post form a thinned circuit structure;
forming a supporting structure on the first surface of the insulating layer, wherein the supporting structure is used to increase an overall thickness of the semiconductor packaging substrate, wherein the supporting structure has at least one through hole for exposing the first end surface of the conductive post, the supporting structure is made of a photosensitive insulating material, and the supporting structure is a removable and disposable structure;
removing the carrier to expose the second surface of the insulating layer and the second electrical surface of the circuit layer, wherein the circuit structure and the supporting structure form a thinned packaging substrate; and
inserting a contact terminal of a test equipment into the through hole to test an electrical state of the circuit layer and the conductive post.

7. The method of claim 6, wherein the through hole of the supporting structure is formed by lithography.

8. The method of claim 6, wherein the supporting structure is made of a photosensitive dielectric material or a photosensitive dry film material.

* * * * *